United States Patent
Xie et al.

(10) Patent No.: US 7,297,640 B2
(45) Date of Patent: Nov. 20, 2007

(54) METHOD FOR REDUCING ARGON DIFFUSION FROM HIGH DENSITY PLASMA FILMS

(75) Inventors: Jun Xie, Singapore (SG); Hoon Lian Yap, Singapore (SG); Chuin Boon Yeap, Singapore (SG); Weoi San Lok, Singapore (SG)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 218 days.

(21) Appl. No.: 11/034,952

(22) Filed: Jan. 13, 2005

(65) Prior Publication Data

US 2006/0154491 A1    Jul. 13, 2006

(51) Int. Cl.
*H01L 21/31* (2006.01)

(52) U.S. Cl. ............ 438/760; 438/597; 438/623; 438/624; 438/687; 438/688; 438/695; 438/710; 438/760; 438/763; 438/784; 257/E21.279

(58) Field of Classification Search ........ 438/760, 438/761, 784, 695, 688
See application file for complete search history.

(56) References Cited

U.S. PATENT DOCUMENTS

| | | | |
|---|---|---|---|
| 6,211,040 B1 * | 4/2001 | Liu et al. ............ | 438/424 |
| 6,268,274 B1 * | 7/2001 | Wang et al. .......... | 438/597 |
| 6,274,514 B1 * | 8/2001 | Jang et al. ........... | 438/778 |
| 6,319,796 B1 | 11/2001 | Laparra et al. ....... | 438/435 |
| 6,365,015 B1 | 4/2002 | Shan et al. ........... | 204/192.3 |
| 6,391,781 B1 | 5/2002 | Ozawa et al. ........ | 438/692 |
| 6,479,881 B2 | 11/2002 | Wang et al. .......... | 257/508 |
| 6,719,885 B2 | 4/2004 | Lin et al. ............. | 204/192.32 |

* cited by examiner

*Primary Examiner*—Michael Lebentritt
*Assistant Examiner*—Kyoung Lee

(57) ABSTRACT

A two-step high density plasma-CVD process is described wherein the argon content in the film is controlled by using two different argon concentrations in the argon/silane/oxygen gas mixture used for generating the high density plasma. The first step deposition uses high argon concentration and low sputter etch-to-deposition (E/D) ratio. High E/D ratio maintains the gap openings without necking. In the second step, a lower argon concentration and lower E/D ratio are used. Since observed metal defects are caused by argon diffusion in the top 200-300 nm of the HDP-CVD film, by controlling argon concentration in the top part of the film (i.e. second step deposition) to a low value, a reduced number of metal defects are achieved.

20 Claims, 2 Drawing Sheets

METHOD FOR REDUCING ARGON DIFFUSION FROM HIGH DENSITY PLASMA FILMS

FIELD OF THE INVENTION

The present invention relates generally to a method of forming a semiconductor device, and more particularly to form defect-free metal interconnect structures with improved inter-level dielectric layers.

DESCRIPTION OF THE PRIOR ART

With the increase in the number of transistors on a given silicon chip, the metal interconnect structures also are becoming dense to handle the wiring requirement for these integrated circuits (IC). Chip size needs to be kept small to maintain the high speed of the IC device and to increase the number of dies per water. This is accomplished by distributing the wiring over several metal layers, the structure being usually known as multi level metal (MLM) layers. It is not uncommon to have upwards of six levels of metal layers with required number of interconnecting via between two successive metal layers.

One conventional method of forming these MLM structures is deposit first level metal on a silicon water having device components (e.g. transistors, resistors); pattern the metal layer to form metal lines using lithography; deposit insulating dielectric materials (e.g. oxide, polymer) in between the gaps; planarize the insulating film to expose the surface of the metal lines; deposit additional thickness of dielectric film and pattern to from via holes where electrical connection is needed to the first level metal; deposit a second metal layer to fill the via holes and to provide necessary thickness to form second wiring level. It is critical to fill the intra-level gaps between the wiring lines with high quality dielectric materials. Choice of correct deposition method is important.

Although chemical vapor deposition (CVD) methods are suitable if filling high aspect ratio (height:gap-width) gaps have been used, they require higher temperatures>600 C. Such temperatures cannot be used since the metal wiring such as Aluminum, AlCu alloys have melting points close to these temperatures. High temperature deposition also creates stresses in deposited dielectric films. Plasma-enhanced CVD has been used since plasma activation reduces the required temperature for deposition. More recently HDP-CVD (high density plasma chemical vapor deposition) methods are being used due to improved conformal filling characteristics mid high deposition rates. Plasma enhanced deposition methods inherently have a sputtering component which causes both etching and deposition at the same time. By adjusting the processing conditions, however, the etching to deposition ratio can be tailored old controlled during the deposition cycle. These methods therefore give rise to stresses in the ILD limits causing defects in metal lines that get buried in ILD films. In the prior art several such method are proposed and discussed.

U.S. Pat. No. 6,211,040 a two step, low argon HDP-CVD oxide deposition process, which prevents dielectric voids, corner dipping, and plasma induced damage. In the first step, a silicon dioxide liner layer is deposited, while keeping the gaps open, using a gas mixture of silane, oxygen, and argon. Argon gas pressure, chamber pressure and RF power are kept, low in the first step. In the second step, a gap filling layer of silicon dioxide is deposited overlying said oxide liner to fill the gaps. In the second step, argon gas pressure and chamber pressure are kept low while the RF sputter energy is increased so that etch-to-deposition ratio is increased to 0.15-0.25. The increase ratio improves gap filling ability without generating voids.

U.S. Pat. No. 6,479,881 describes a low temperature process for forming inter-metal gap-filling (gap <0.25 nm) insulating layers in silicon IC. The double dielectric layer is formed by an in-situ low temperature two step deposition HDP-CVD process separated by a cool-down period. The low temperature process mitigates metal line defects such as distortion or warping caused by heat generated during the process. The first deposition step is done at low deposition-to-sputtering ratio of 2-4 and helium wafer back pressure of 8 (inner region) and 10 (outer region) torr. Following the first deposition step, a cool-down period is allowed without any deposition or etching with just the inert gas at the backside of the wafer. The second deposition step then follows with a deposition-to-sputtering ratio of 4-6 and helium back pressure of 6 (inner) and 10 (outer) torr.

U.S. Pat. No. 6,719,885 describes a process for reducing stress induced defects in an HDP-CVD process. In the first step of a multi-step deposition process, the deposition takes place at temperature ranges less than about 350 C. Preferably, a temperature differential between a maximum deposition temperature and a minimum cooling temperature is less than about 70 C. The second and subsequent deposition steps are carried out at relatively lower temperature ranges of, for example, about 270 C quad 340 C. Preferably, one or more deposition steps following the first one are done at higher deposition-to-sputter (D/S) ratio thereby lowering deposition temperature range. In one embodiment, the patent uses a D/S ratio of about 2.8-3.2 in the first step and about 5.6-6.2 during the second deposition step. Yet in another embodiment, cooling steps are interposed between deposition steps.

The prior art patents do not disclose or discuss the defects caused by the incorporation of argon atoms in the dielectric film during HDP-CVD process. The deposition process uses argon of necessity to provide the sputter etching component needed to achieve superior gap-filling properties. The sputter-etch component keeps the gaps in the metal reasonably open for deposition species to enter the gap. This is more important in the beginning of the process since the aspect ratio of the gap is high. At a later stage when the gaps are filled and the gap aspect ratio gets reduced, higher etch component is not necessary. During this step, diffusion of argon can cause argon incorporation in the top part of the film which later can cause delamination of the next level metal. Such metal defect formation due to argon incorporation has been observed by the inventors of this application. The invention aims to overcome these defects.

SUMMARY OF THE INVENTION

Accordingly, the main object of this invention is to describe a multiple-step HDP-CVD method for filling gaps of a multi-level metal interconnect structure.

It is yet another object to describe a two-step HDP-CVD process for filling inter-metal line gaps with reduced metal defects.

Another object of this invention is to describe a two-step HDP-CVD process to minimize die argon content in the top part of said gap filling inter level dielectric film in order to reduce metal defects.

In accordance with these objectives, a two-step HDP-CVD process is described wherein the argon content in the film is controlled by using two different argon concentrations in the argon/silane/oxygen gas mixture. The first step deposition uses high argon concentration and low sputter etch-to-deposition (E/D) ratio. In the second step, a lower argon concentration mid lower E/D ratio are used. By controlling argon concentration in the top part of the film to a low value, a reduced number of metal defects are achieved.

BRIEF DESCRIPTION OF THE DRAWINGS

The objects, advantages, and details of depositing gap-filling inter level dielectric film according to this invention will be more clearly understood from the following detailed description taken in conjunction with the accompanying drawings.

DETAILED DESCRIPTION OF THE INVENTION

Figure 1:
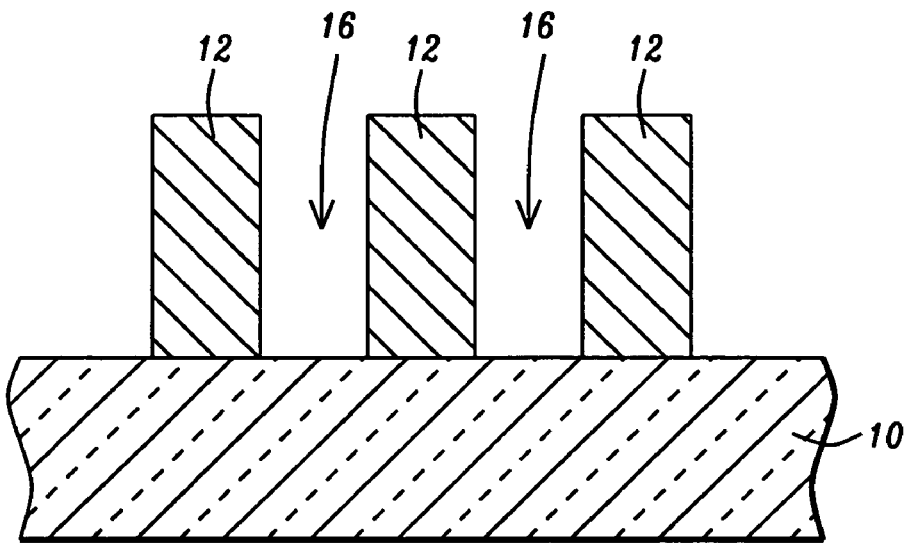
FIG. 1 is a schematic cross section of silicon substrate having device components, showing metal wires.
Figure 2:
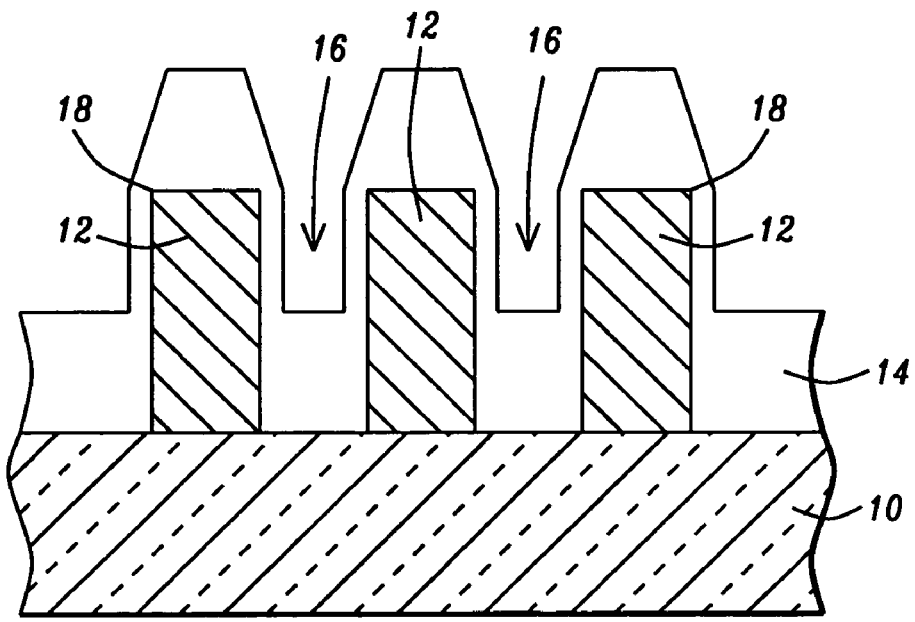
FIG. 2 is schematic cross section of one level metal interconnect structure after deposition of the gap filling dielectric film using the first deposition step of the invention

A first HDP-CVD inter level dielectric film 14 is then deposited, with the object of filling the gaps 16 between metal lines. HDP-CVD method is chosen since the film can be deposited at less than 400 C and the film quality is superior in terms gap-filling characteristics, density, and pinholes. Since the HDP-CVD is a plasma deposition method, it has both deposition and sputter etching components built-in. By controlling the ratio of sputter etching (E) and deposition (D) components, it is possible to tailor the properties of the films and gap-filling characteristics. For example, while filling high aspect ratio (height-to-gap width) gaps the openings of the gaps can get closed prematurely and produce large voids or key holes in the deposited film. By adjusting the etching component in the process, the gap openings can be kept open to achieve a more bottom-up filling. Too much of the etching component can result in metal line corner faceting since sputter etching can also erode metal corners 18 shown in FIG. 2. The process used in the first step is: ratio of argon-to-silane-to-oxygen of approximately about 1:1:1.4 and an E/D ratio in the range of about 0.1-0.3, RF power of approximately about 2500-2900 watts, and chamber pressure of approximately about 1-4 mtorr. Argon concentration in the gas mixture is in the range of about 25% -35%. Although some argon gets incorporated at these process conditions, the film being at the bottom of the gap does not contribute to metal defects. This process achieves the right gap filling characteristics by keeping the gaps open during this first part of the process with higher etching component. The resulting structure is shown in FIG. 2.

Figure 3:
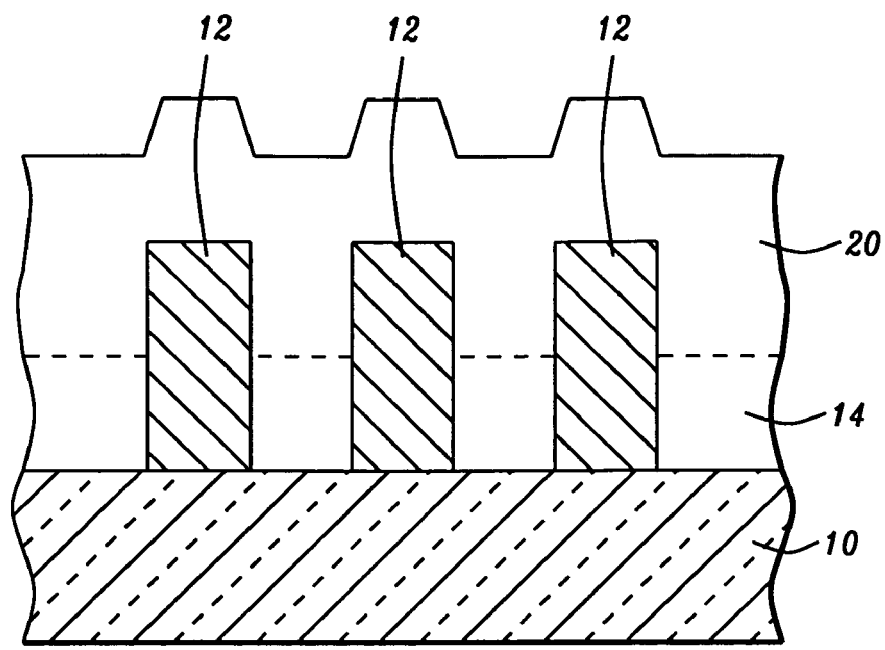
FIG. 3 is schematic cross section of a one level metal interconnect structure after deposition of the gap filling dielectric film using the second deposition step of the invention.

The second HDP-CVD step is done such that argon incorporation in the top part of the film 20 is not significant and is below the threshold of defect formation. The parameters of this step are: argon-to-silane-to-oxygen ratio of about 1:1.5:3 and E/D ratio in the range of approximately about 0.02-0.06, RF power of approximately about 2500-2900 watts, and chamber pressure of approximately about 2-6 mtorr. Argon concentration in this step is in the range of about 15% -25%. Due to higher deposition component, the second step fills the gaps without any voids, the bottom part having been filled void-free from the first lower B/D ratio step. The resulting structure is shown in FIG. 3.

Figure 4:
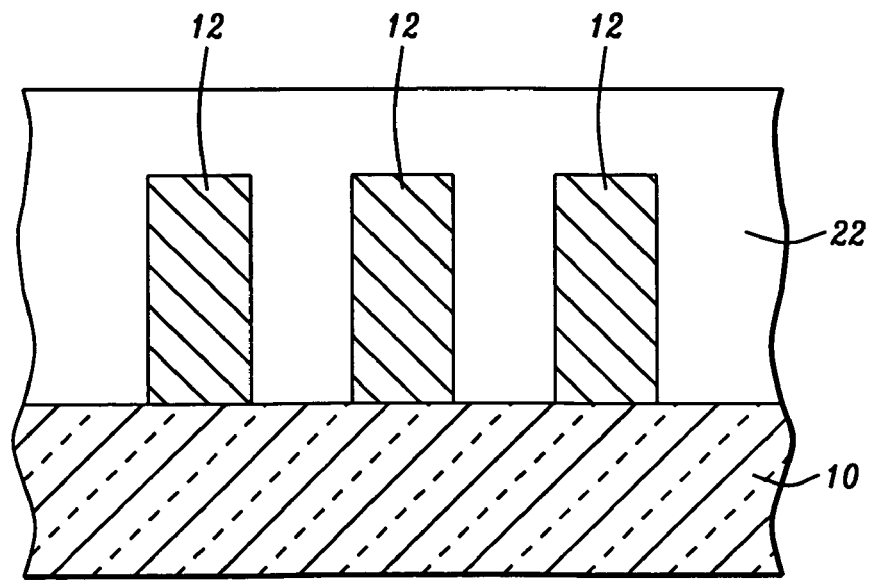
FIG. 4 is a schematic cross section of one level metal interconnect after deposition of the gap filling dielectric film using said two steps of the invention and planarization.

After depositing an additional thickness of the ILD film, the film is planarized either by CMP (chemical mechanical planarization) or plasma etch back processes known in prior art. The planar structure with gap-filling HDP-CVD film 22 is shown in FIG. 4.

The advantage of this invention over prior art is:

1. Minimal argon incorporation and thereby reduction of metal defects.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of high plasma density chemical vapor deposition (HDP-CVD) of a dielectric film, the steps comprising:
   providing a semiconductor substrate having device elements and metal wiring pattern with gaps overlying said semiconductor substrate;
   forming a dielectric film to fill said gaps using multiple HDP-CVD steps, one of the steps at a first concentration of inert gas and a first pressure, a later of the steps at a second concentration of inert gas less than the first concentration of inert gas and a second pressure higher than the first pressure; and
   planarizing said dielectric film.

2. The method of high plasma density chemical vapor deposition (HDP-CVD) of a dielectric film according to claim 1, wherein said metal wiring pattern comprises aluminum, aluminum-copper alloy, and or copper.

3. The method of high plasma density chemical vapor deposition (HDP-CVD) of a dielectric film according to claim 1, wherein said dielectric film comprises silicon dioxide, fluorinated silicon dioxide, low dielectric constant inorganic materials, low dielectric constant organic materials, and/or porous inorganic and organic materials.

4. The method of high plasma density chemical vapor deposition (HDP-CVD) of a dielectric film according to claim 1, wherein said multiple step HDP-CVD method comprises two deposition steps.

5. The method of high plasma density chemical vapor deposition (HDP-CVD) of dielectric film according to claim 4, wherein said first and second dielectric deposition steps are done using argon, silane, and oxygen gas mixture.

6. The method of high plasma density chemical vapor deposition (HDP-CVD) of a dielectric film according to claim 5, wherein said gas mixture ratio in said first dielectric deposition step is approximately about 1:1:1.4 of argon:silane:oxygen respectively and having argon concentration in the range of approximately about 25%-35% by volume.

7. The method of high plasma density chemical vapor deposition (HDP-CVD) of a dielectric film according to claim 5, wherein said first step dielectric deposition is done with a process such that sputter-etch:deposition component ratio range is approximately about 0.1-0.3.

8. The method of high plasma density chemical vapor deposition (HDP-CVD) of a dielectric film according to claim 5, wherein said gas mixture ratio in said second dielectric deposition step is approximately about 1:1.5:3 of argon:silane:oxygen respectively and having argon concentration in the range of approximately about 15%-25% by volume.

9. The method of high plasma density chemical vapor deposition (HDP-CVD) of a dielectric film according to claim 5, wherein said second step dielectric deposition is done with a process such that sputter-etch:deposition component ratio range is approximately about 0.02-0.06.

10. The method of high plasma density chemical vapor deposition (HDP-CVD) of dielectric film according to claim 5, wherein said first deposited film thickness range is approximately about 300-500 nm.

11. The method of high plasma density chemical vapor deposition (HDP-CVD) of a dielectric film according to claim 5, wherein said second deposited film thickness range is approximately about 300-500 nm.

12. A method of high plasma density chemical vapor deposition (HDP-CVD) of a dielectric film with steps comprising:
    forming a metal pattern having gaps on a silicon substrate having device elements;
    depositing a gap-filling dielectric film with a two step HDP-CVD process; and
    planarizing said dielectric film.

13. The method of high plasma density chemical vapor deposition (HDP-CVD) of a dielectric film according to claim 12, wherein said metal wiring pattern comprises aluminum, aluminum-copper alloy, and or copper.

14. The method of high plasma density chemical vapor deposition (HDP-CVD) of a dielectric film according to claim 12, wherein said gap-filling dielectric film comprises silicon dioxide, fluorinated silicon dioxide, low dielectric constant inorganic materials, low dielectric constant organic materials, and/or porous inorganic and organic materials.

15. The method of high plasma density chemical vapor deposition (HDP-CVD) of dielectric film according to claim 12, wherein said gas mixture ratio in said first dielectric deposition step is approximately about 1:1:1.4 of argon:silane:oxygen respectively and having argon concentration in the range of approximately about 25%-35% by volume.

16. The method of high plasma density chemical vapor deposition (HDP-CVD) of a dielectric film according to claim 12, wherein said first dielectric deposition is done with a process such that sputter-etch:deposition component ratio range is approximately about 0.1-0.3.

17. The method of high plasma density chemical vapor deposition (HDP-CVD) of a dielectric film according to claim 12, wherein said second dielectric deposition step is approximately about 1:1.5:3 of argon:silane:oxygen respectively and having argon concentration in the range of approximately about 15%-25% by volume.

18. The method of high plasma density chemical vapor deposition (HDP-CVD) of a dielectric film according to claim 17, wherein said second dielectric deposition is done with a process such that sputter-etch:deposition component ratio range is approximately about 0.02-0.06.

19. The method of high plasma density chemical vapor deposition (HDP-CVD) of a dielectric film according to claim 12, wherein said first and second gap-filling dielectric film thickness ranges are approximately about 300-500 nm and 300-500 nm respectively.

20. A method of high plasma density chemical vapor deposition (HDP-CVD) of a dielectric film with steps comprising:
    forming a metal pattern having gaps on a silicon substrate having device elements;
    depositing a gap-filling dielectric film with a two step HDP-CVD process; first dielectric film with thickness in the range of approximately about 300-500 nm, deposited using a argon:silane:oxygen gas mixture with a ratio of approximately about 1:1:-1.4 at a first pressure and with sputter-etch:deposition ratio of approximately about 0.1-0.3; and second dielectric film with thickness in the range of approximately about 300-500 nm, deposited using argon:silane:oxygen gas mixture in the range of approximately about 1:1.5:3 at a second pressure higher than the first pressure and with sputter-etch:deposition ratio of approximately about 0.02-0.06; and
    planarizing said dielectric film.

* * * * *